United States Patent
Haba et al.

(12) 
(10) Patent No.: US 10,593,563 B2
(45) Date of Patent: Mar. 17, 2020

(54) FAN-OUT WAFER LEVEL PACKAGE WITH RESIST VIAS

(71) Applicant: Invensas Corporation, San Jose, CA (US)

(72) Inventors: Belgacem Haba, Saratoga, CA (US); Ilyas Mohammed, Santa Clara, CA (US); Rajesh Katkar, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 26 days.

(21) Appl. No.: 15/873,218

(22) Filed: Jan. 17, 2018

(65) Prior Publication Data

US 2018/0301350 A1 Oct. 18, 2018

Related U.S. Application Data

(60) Provisional application No. 62/484,974, filed on Apr. 13, 2017.

(51) Int. Cl.
*H01L 21/48* (2006.01)
*H01L 21/56* (2006.01)
(Continued)

(52) U.S. Cl.
CPC .......... *H01L 21/486* (2013.01); *H01L 21/568* (2013.01); *H01L 21/6835* (2013.01);
(Continued)

(58) Field of Classification Search
CPC ... H01L 21/486; H01L 21/561; H01L 21/568; H01L 21/6835; H01L 21/78;
(Continued)

(56) References Cited

U.S. PATENT DOCUMENTS 5,300,813 A * 4/1994 Joshi ................. H01L 21/76838
257/752
8,535,980 B2 9/2013 Chua et al.
(Continued)

FOREIGN PATENT DOCUMENTS

JP 2014-533892 A 12/2014
KR 10-2011-0076606 A 7/2011
(Continued)

OTHER PUBLICATIONS

International Search Report and Written Opinion for PCT/US2018/027112, dated Jul. 27, 2018, 15 pages.

*Primary Examiner* — Mohammed Shamsuzzaman

(57) ABSTRACT

Fan-out wafer level packages with resist vias are provided. In an implementation, an example wafer level process or panel fabrication process includes adhering a die to a carrier, applying a temporary resist layer over the die and the carrier, developing the resist layer to form channels or spaces, filling the channels or the spaces with a molding material, removing the remaining resist to create vias in the molding material, and metalizing the vias in the molding material to provide conductive vias for the microelectronics package. The methods automatically create good via and pad alignment. In another implementation, an example process includes adhering a die to a carrier, applying a permanent resist layer over the die and the carrier, developing the resist layer to form vias in the resist layer, and metalizing the vias in the remaining resist of the permanent resist layer to provide conductive vias for the microelectronics package. Assemblies may be constructed with the semiconductor dies face-up or face-down. One or more redistribution layers (RDLs) may be built on one or both sides of an assembly with resist vias.

8 Claims, 11 Drawing Sheets

(51) Int. Cl.
*H01L 21/78* (2006.01)
*H01L 23/538* (2006.01)
*H01L 25/10* (2006.01)
*H01L 23/00* (2006.01)
*H01L 23/498* (2006.01)
*H01L 21/683* (2006.01)
*H01L 23/31* (2006.01)

(52) U.S. Cl.
CPC ........ *H01L 21/78* (2013.01); *H01L 23/49816* (2013.01); *H01L 23/5389* (2013.01); *H01L 24/05* (2013.01); *H01L 24/13* (2013.01); *H01L 24/20* (2013.01); *H01L 24/82* (2013.01); *H01L 24/96* (2013.01); *H01L 25/105* (2013.01); *H01L 21/561* (2013.01); *H01L 23/3121* (2013.01); *H01L 2221/68345* (2013.01); *H01L 2224/73267* (2013.01); *H01L 2224/83101* (2013.01); *H01L 2224/92144* (2013.01)

(58) Field of Classification Search
CPC . H01L 2221/68345; H01L 2224/83101; H01L 2224/92144; H01L 23/3121; H01L 23/49816; H01L 23/5389; H01L 24/05; H01L 24/13; H01L 24/20; H01L 24/82; H01L 24/96; H01L 25/105
See application file for complete search history.

(56) References Cited

U.S. PATENT DOCUMENTS

| | | | |
|---|---|---|---|
| 8,772,086 B2* | 7/2014 | Janzen | H01L 21/76898 438/109 |
| 2011/0221018 A1* | 9/2011 | Shi | B81B 7/007 257/432 |
| 2011/0252637 A1 | 10/2011 | Endo et al. | |
| 2012/0161332 A1* | 6/2012 | Chua | H01L 21/486 257/774 |
| 2013/0267046 A1* | 10/2013 | Or-Bach | H01L 27/088 438/14 |
| 2014/0008809 A1* | 1/2014 | Scanlan | H01L 21/561 257/773 |
| 2017/0345738 A1* | 11/2017 | Edelstein | H01L 21/8221 |
| 2017/0373044 A1* | 12/2017 | Das | H01L 21/02063 |
| 2018/0086627 A1* | 3/2018 | Lin | H01L 21/76829 |
| 2018/0102470 A1* | 4/2018 | Das | H01L 25/0652 |
| 2018/0151502 A1* | 5/2018 | Lin | H01L 24/20 |
| 2019/0172921 A1* | 6/2019 | Dewey | H01L 29/41733 |

FOREIGN PATENT DOCUMENTS

| | | |
|---|---|---|
| KR | 10-2011-0114165 A | 10/2011 |
| KR | 10-2015-0144305 A | 12/2015 |

* cited by examiner

FIG. 7

FAN-OUT WAFER LEVEL PACKAGE WITH RESIST VIAS

RELATED APPLICATIONS

This patent application claims the benefit of priority to U.S. Provisional Patent Application No. 62/484,974 to Haba et al., filed Apr. 13, 2017 and incorporated by reference herein in its entirety.

BACKGROUND

In conventional wafer-level packages, input-output terminals are located over the chip surface area, limiting the number of possible input-output connections. Fan-out wafer level packages (FOWLP) conventionally have a smaller package footprint with greater input-output connections, compared to standard wafer-level packages (WLPs), thereby providing a higher integration level and also a higher number of external electrical contacts.

Conventional fan-out wafer level packages embed each individual die in a low cost epoxy mold compound (EMC) with space allotted between each die for additional input-output points. Redistribution layers (RDLs) are then formed to "fan out" the input-output connections using physical vapor deposition (PVD) seeding, electroplating, and patterning to reroute the input-output connections on the die to the periphery of the epoxy mold compound.

These conventional fan-out wafer level packages require a bumped die (e.g., solder balls), and package-on-package vias that are drilled, plated, etched, or preformed. The fan-out packages demand good alignment between die pads and vias due to die shift, and achieving good alignment can add to the cost.

SUMMARY

Fan-out wafer level packages with resist vias are provided. In an implementation, an example wafer level process or panel fabrication process includes adhering a die to a carrier, applying a temporary resist layer over the die and the carrier, developing the resist layer to form channels or spaces, filling the channels or the spaces with a molding material, removing the remaining resist to create vias in the molding material, and metalizing the vias in the molding material to provide conductive vias for the microelectronics package. The methods automatically create good via and pad alignment. In another implementation, an example process includes adhering a die to a carrier, applying a permanent resist layer over the die and the carrier, developing the resist layer to form vias in the resist layer, and metalizing the vias in the remaining resist of the permanent resist layer to provide conductive vias for the microelectronics package. Assemblies may be constructed with the semiconductor dies face-up or face-down. One or more redistribution layers (RDLs) may be built on one or both sides of an assembly with resist vias.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

FIG. 7 is a diagram of an example process for making vias in an example microelectronics package with dies face-up, using permanent resist.

DESCRIPTION

Figure 1:
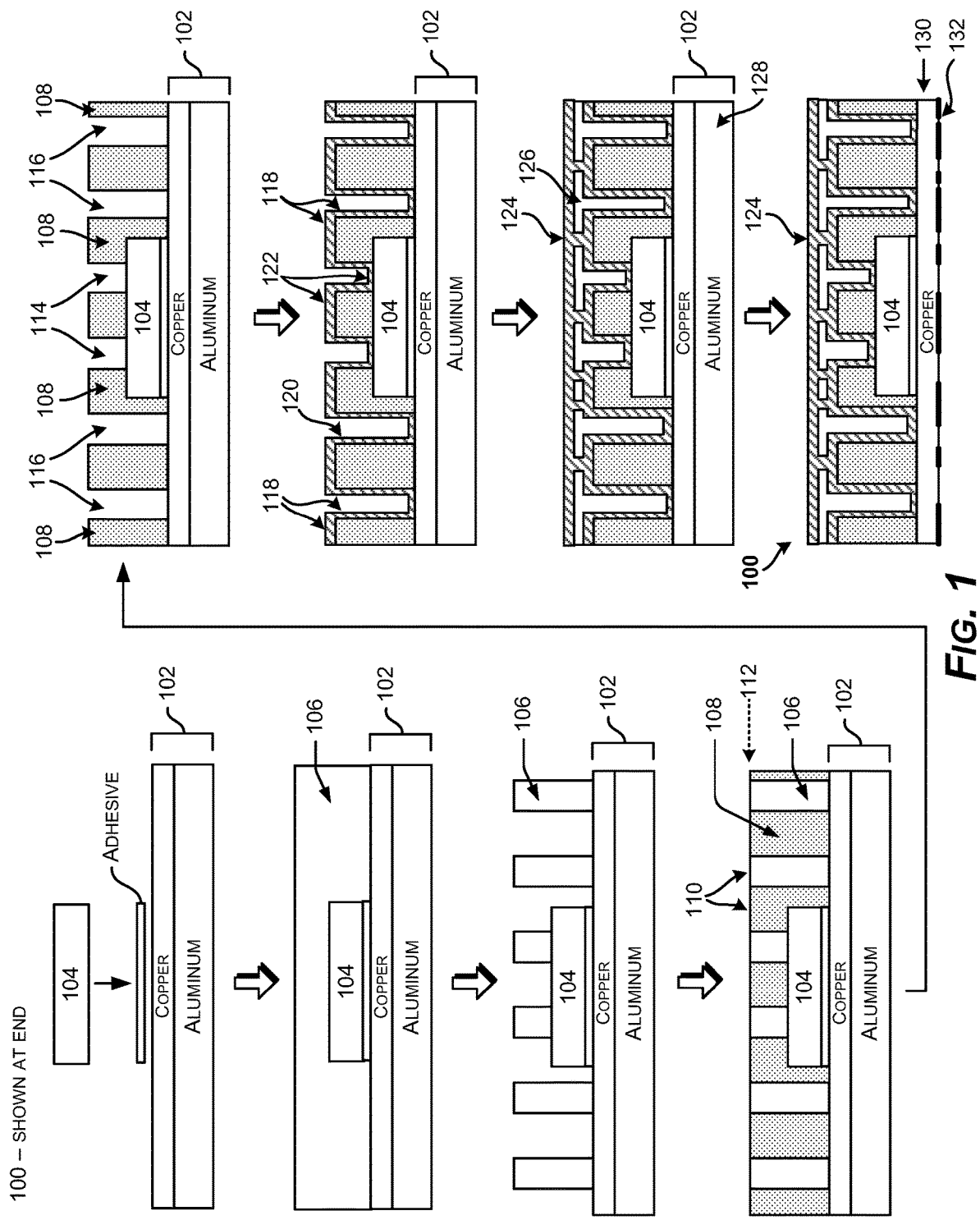
FIG. 1 is a diagram of an example process for making vias in an example wafer level package using a temporary resist, such as a photoimagable resist, to shape a molding.

This disclosure describes example fan-out wafer level packages (FOWLP) with resist vias. An example process uses a layer of resist, such as photo-resist, to create contact vias and package-on-package (POP) vias simultaneously, integrating bumping the die at the same time as POP vias, or eliminating bumping altogether, while improving alignment and minimizing cost.

The example process can be used for wafer level packages, but can also be used as a large panel process.

In an implementation, after a die is bonded to a carrier, a temporary layer of resist is applied and patterned to provide a template for mold material. The mold material is added, molded around the temporary resist. The resist is then removed leaving via channels in the mold material, and the surface of the mold material is metalized to directly form contact vias, package-on-package vias, and die pads, all in the same process step. These vias can be smooth in contrast with lased vias. Metalization of the vias can be accomplished by plating both the POP vias and the pad vias simultaneously and conformly. Thus, the contact vias and the package-on-package vias are made together. It may take only one lithography pass to expose the package-on-package (POP) vias and die pad vias, thereby providing great registration.

In another implementation, after a die is bonded to a carrier, a permanent layer of resist is applied and patterned, and then the surface of the patterned resist itself is metalized to form contact vias, package-on-package vias, and die pads, all in the same processing step. In this implementation, permanent resist is used instead of the mold material.

The example process can be used with the die facing up or the die facing down on carrier.

An example carrier for these example processes may have two layers, including support layer and a conductor layer, such as copper. The die can be attached to the copper side of the carrier, and then the support layer removed later after the resist process and metalization steps described above have been achieved. The remaining copper layer can become a redistribution layer (RDL) that is already attached and perfectly aligned after patterning. For example, an aluminum/copper substrate (for example, Al/Cu in thicknesses of 150 µm/18 µm, respectively) can be used as the carrier, with the aluminum being dissolved at the end to leave the remaining copper layer as a RDL back layer, without extra cost or effort. Part of the carrier can remain and stays a RDL layer.

In an implementation, the die is permanently bonded to the carrier from the outset, eliminating the need for handling carriers that require temporary adhesives and that require release of the die from the carrier at some point. The die can be placed and cured, and thereby secured in place to the carrier, which eliminates the possibility of unwanted movement during molding.

Adhesives for the example package-on-package processes can be selected to have properties, such as a selected density, that provide a balanced package or a package-on-package assembly that has homogeneous density and balance. In an implementation, a balanced structure can be achieved when the adhesive is made thick and physical properties of the adhesive are chosen to balance the top side, for example.

An example process can eliminate the need for bumping the die, while providing excellent alignment of vias and die pads, and while also minimizing cost. In some cases, there is no need for bumping the die (usually 40-50 µm Cu bumping), yet the mold material still covers the die for reliability.

The procedures introduced above can also provide a very thin fan-out wafer level package (FOWLP).

In an implementation, the example processes provide coplanar aspects of a top surface that eliminate the need to polish the top, in some circumstances.

Example Processes and Structures

FIG. 1 shows an example wafer level package 100 with one or more fan-out conductor layers 124 during an example process of assembly. The illustration is diagrammatic, components are not shown in real size or in relative scale to each other, but are stylized for the sake of description. In a beginning step, a carrier 102 is provided that may consist of a metal or metals, such as copper bonded to aluminum, or may consist of another rigid material. The aluminum, for example, may provide a support layer of the carrier 102, while the copper may provide a conductive layer of the carrier 102. A die 104 is permanently adhered to the carrier 102. The die 104 may be attached to the carrier 102 as a single raw die, as a packaged die, as stacked dies, as side-by-side dies, or as a die with a redistribution layer (RDL). Temporary resist 106, such as a photoimagable resist 106, is applied over the die 104 and over the carrier 102, and the temporary resist 106 is developed, for example, by photolithography. Molding material 108 is applied over the top of the package. The top surface 110, including the top surface of the molding material 108 and the top surface of the temporary photoresist 106 may be planarized 112. The temporary photoresist 106 is then removed, leaving vias 114 over the die 104 and vias 116 through the molding material 108, suitable for providing package-on-package (POP) through-vias. This patterned molding material 108 is metalized 118 to form conductive vias 120 and pads 122. One or more RDL layers 124 may be formed on top, with a dielectric 126 or other filler in the interstices. A support layer of the carrier 102, such as an aluminum layer 128, may be removed, and when used with the carrier 102, a copper layer 130 of the carrier 102 may remain as a back RDL layer 132, for example.

Figure 2:
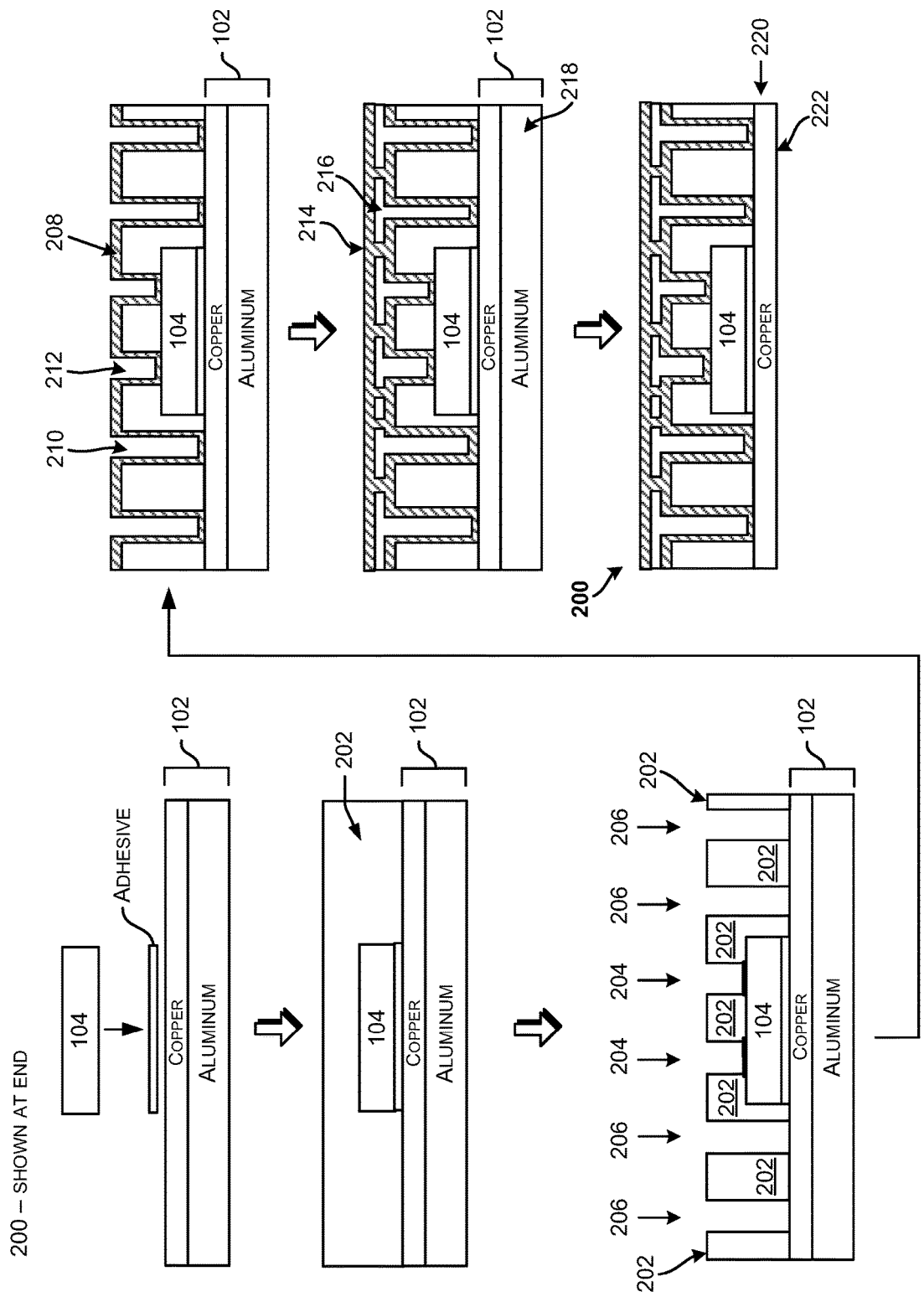
FIG. 2 is a diagram of an example process for making vias in an example wafer level package using a permanent resist for the vias.

FIG. 2 shows an example wafer level package 200 with one or more fan-out conductor layers in an example process of assembly. In a beginning step, a carrier 102 is provided, which may consist of a metal or metals, such as copper bonded to aluminum, or may consist of another rigid material. The aluminum, for example, may provide a support layer of the carrier 102 while the copper may provide a conductive layer of the carrier 102. A die 104 is permanently adhered to the carrier 102. The die 104 may be attached to the carrier 102 as a single die, or as a packaged die, stacked dies, side-by-side dies, or as a die with a redistribution layer (RDL) already attached. Permanent resist 202, such as photoimagable resist 202 is applied over the die 104 and over the carrier 102. The permanent resist 202 is developed by photolithography, for example, leaving contact vias 204 over the conductive pads of the die 104 and also vertical vias 206 through the permanent resist material 202. Alternatively, vias 204 & 206 may be drilled or otherwise formed or placed in the permanent resist 202 instead of, or in addition to, developing the resist 202 to form the vias 204 & 206. The vertical vias 206 are suitable for use as package-on-package (POP) through-vias. In contrast to the implementation of FIG. 1 described above, in the implementation of FIG. 2, the photoresist material 202 remains permanently in place, and takes the place of the molding material 108 in the implementation of FIG. 1. This developed resist 106 is then metalized 208 to form conductive vias 210 & 212. One or more RDL layers 214 may be formed on top, with a dielectric 216 or other filler in the interstices. A support layer 218 of the carrier 102 may be removed, and when used with the carrier 102, a copper layer 220 of the carrier 102 may remain as basis for a backside RDL layer 222.

Figure 3:
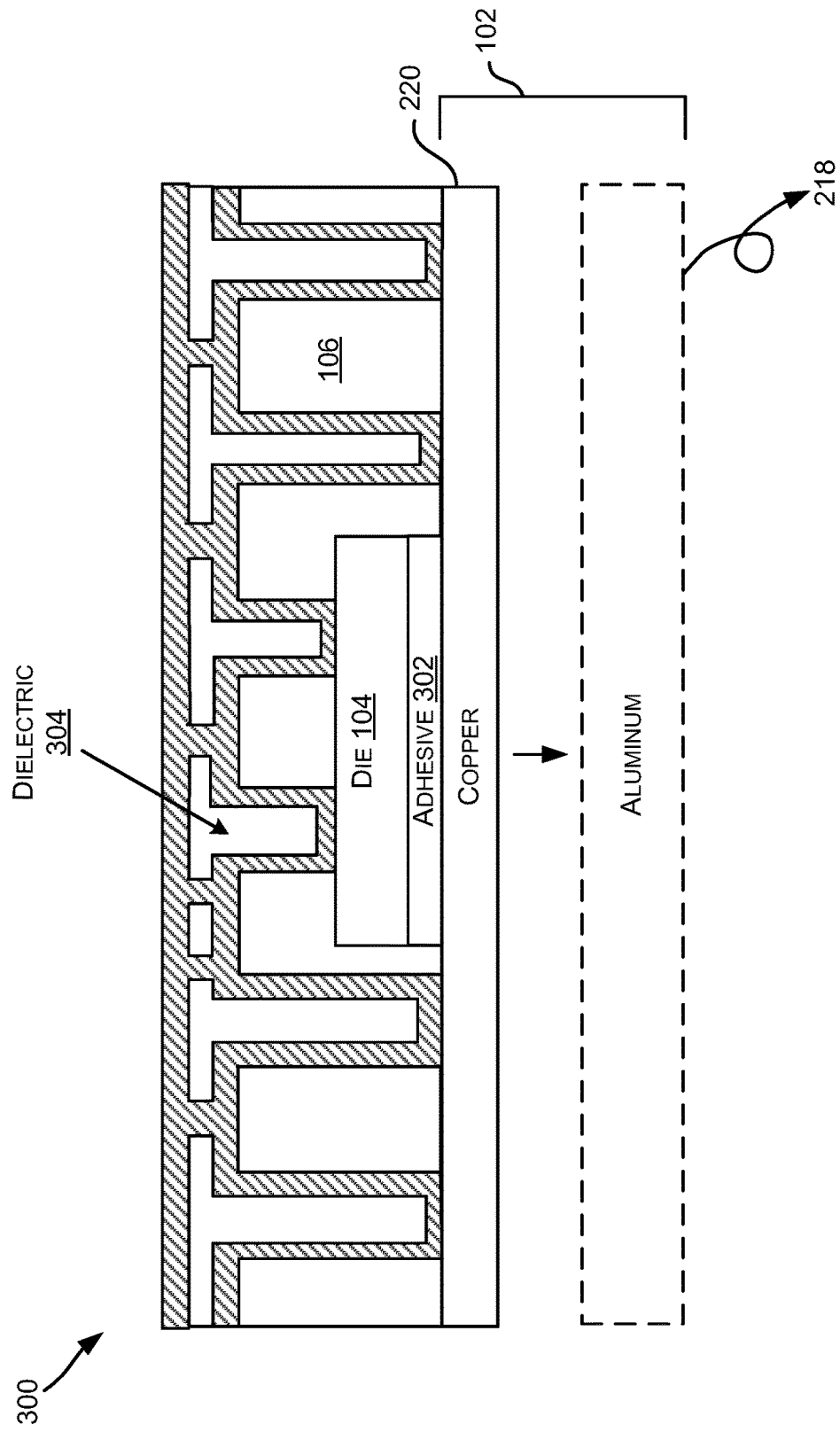
FIG. 3 is a diagram of an example microelectronics package, showing selection of an adhesive thickness and density to balance dielectric filler properties in the microelectronics package.

FIG. 3 shows an example wafer level package 300 in which the die 104 is attached to the carrier 102 with an adhesive 302. The support layer 218 of the carrier has been removed. FIG. 3 shows the location of the adhesive 302 binding the die 104 to the remaining conductive layer 220 of the carrier 102, and also shows a dielectric 304 or other filler in the spaces above the die 104. The adhesive 302, and the dielectric 304 as an example filler, may be selected for similarity of physical properties, such as density, to balance the package or assembly, or may be selected to have complementary physical properties. This allows the adhesive 302 and/or the dielectric filler 304 to determine the deportment of the package 300, in light of the physical properties of the resist 106 or the molding 108 (not shown) that remains permanently in the package 300 as walls of the various vias formed. The thickness and density of the adhesive 302 binding the die 104 to the carrier 102 may be selected to balance or compensate for the thickness and density of the dielectric filler 304, or to balance or compensate for the combination of resist 106 and dielectric filler 304, or the combination of molding material 108 (not shown) and dielectric filler 304. In general, the physical properties of the materials above the die 104 and the materials to be used below the die 104 may be selected to balance each other.

Figure 4:
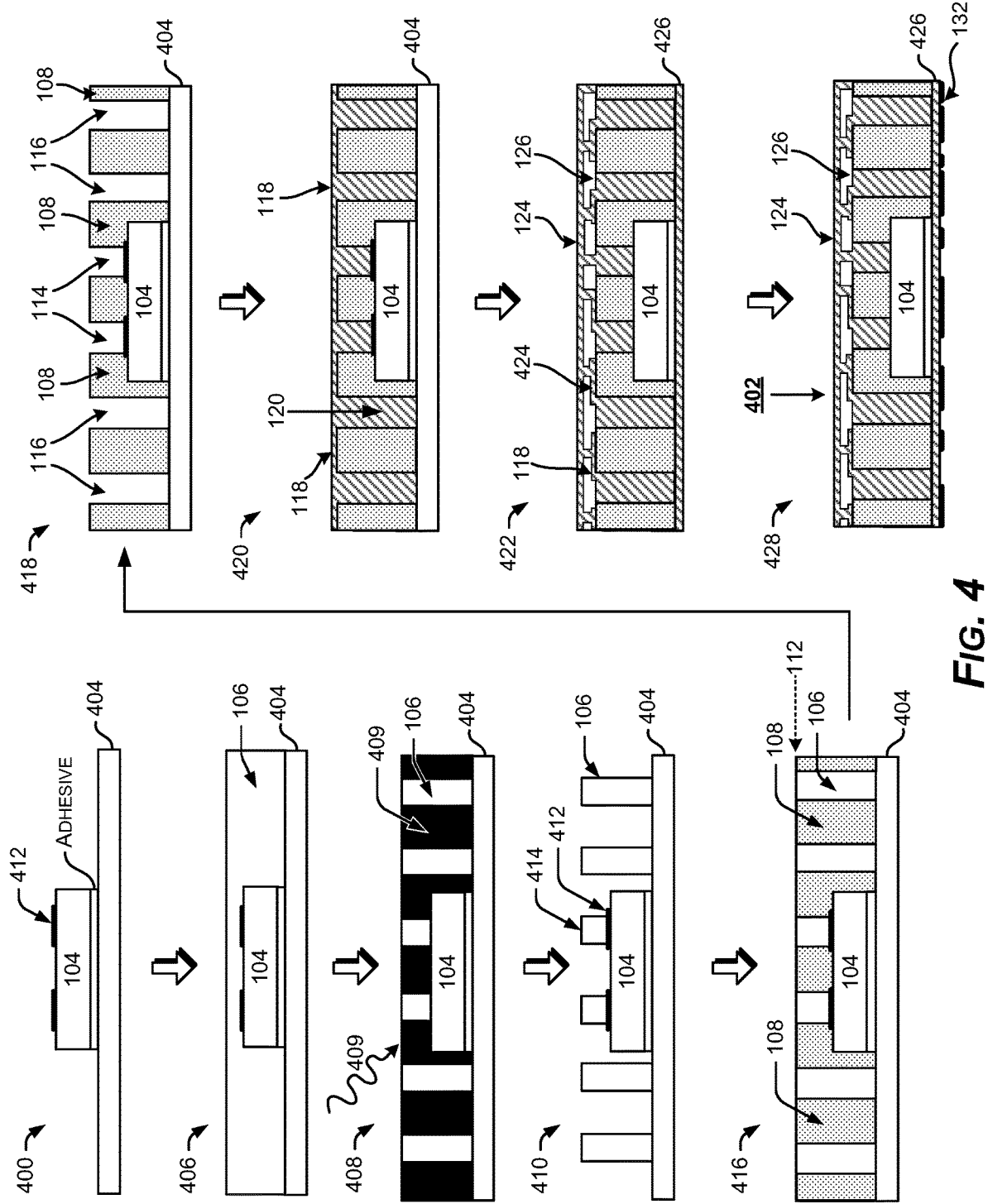
FIG. 4 is a diagram of an example process for making vias in an example microelectronics package with dies face-up, using temporary resist.

FIG. 4 shows an example assembly process 400 of manufacturing a fan-out wafer level package 402 (shown at last step in FIG. 4), with the die 104 face-up (pads 412 face-up), and a temporary resist 106 used in the manufacture. Fabrication of an example package 402 begins with attaching a die 104 to a metal sheet or an RDL on a carrier 404. The die 104 may be a single die, or may be a packaged die, stacked dies, side-by-side dies, with pads 412 face up. At 406, temporary resist 106, such as a photoimagable resist 106, is applied over the die 104 and over the carrier 404. At 408, the temporary resist is developed 409, for example, by photolithography. At 410, this technique automatically establishes alignment between die pads 412 and (future) conductive posts 414 that will be materialized later in the process 400 in place of the temporary resist 106. At 416, molding material 108 is applied into the top surface of the package, including the top surface of the molding material 108 and the top surface of the temporary photoresist 106. The top surface may be planarized 112. At 418, the temporary photoresist 106 is then stripped or otherwise removed leaving patterned molding material 108 that has vias 114 over the die 104 and its pads 412 suitable for being metalized and bumped later, at a higher level, at the same time as package-on-package bumping, and that has longer vertical vias 116 through the molding material 108, suitable for package-on-package (POP) through-vias that can be bumped at the same time as the vias 114 over the die 104. At 420, this patterned molding material 108 is plated or metalized with a conductor 118 to form conductive vias 120 and pads. At 422, the conductor 118 that has been plated, deposited, or otherwise metalized over the molding material 108 can be patterned 424 into circuits and/or RDLs. One or more additional RDL layers 124 may be formed on top for providing fan-out conductive traces, with dielectric 126 or other filler occupying voids and supporting the RDLs 124. A support component of the carrier 404 may be removed, leaving a conductive layer 426. At 428, one or more backside RDL layers 132 may also be added.

Figure 5:
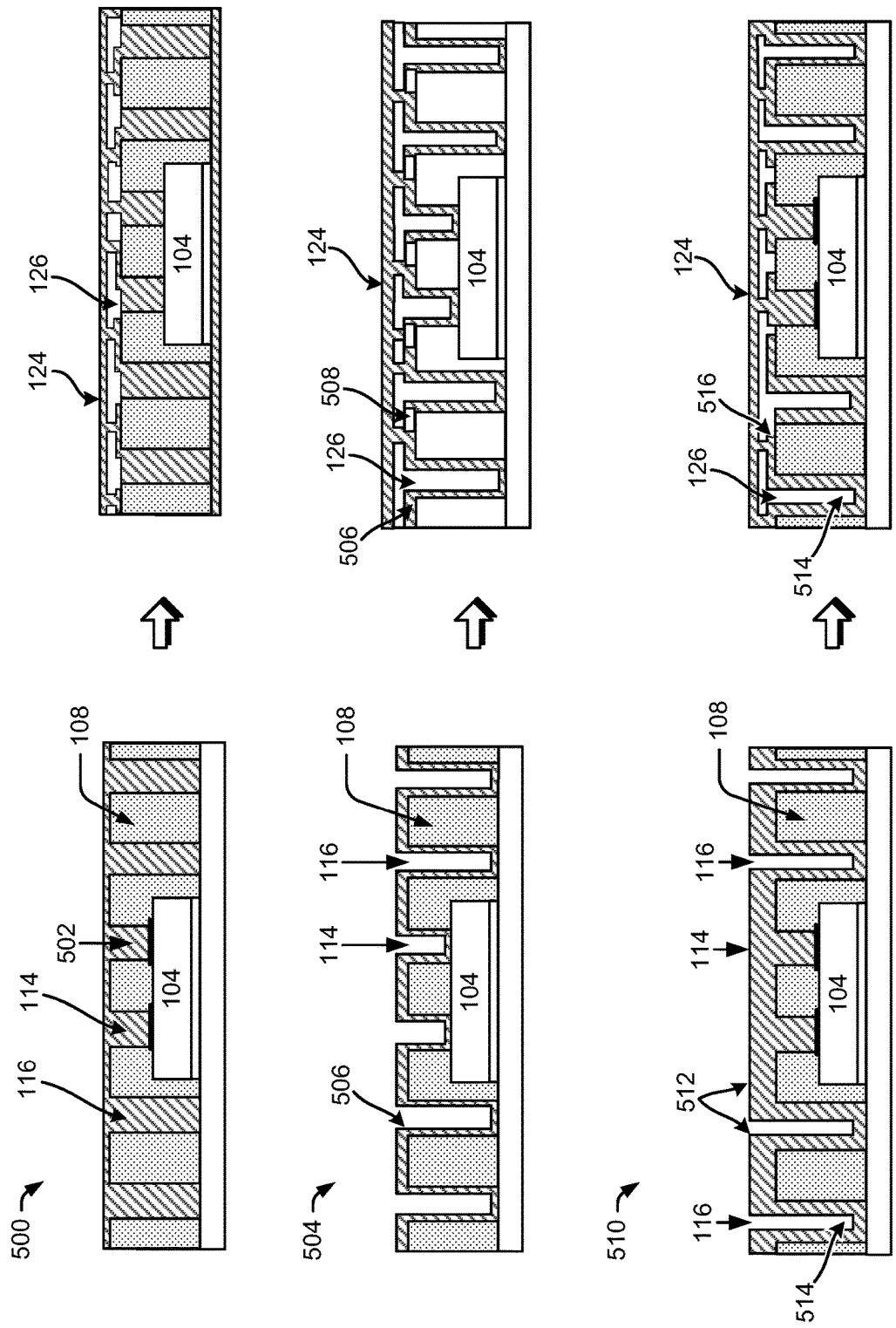
FIG. 5 is a diagram showing different example techniques for metalizing or filling the resist vias.

FIG. 5 shows various techniques of filling vias 114 & 116. Vias 114 & 116 may be formed in process 400 of FIG. 4, for example, which leaves patterned molding material 108 in place after temporary photoresist 106 is removed. A first process 500 completely fills vias 114 and vias 116 with metal 502, through seeding, plating, deposition, or other metalization techniques. One or more RDL layers 124 may be formed on the top surface of the package after the vias 114 & 116 are filled with metal 502. Dielectric material 126 or other nonconductive fillers may be used over pads, around posts, and under one or more RDLs 124 built up on top of the package.

A second process 504 plates or deposits a metal layer 506 within the vias 114 & 116. The metal layer 506 is thinner than the complete metalization 502 deposited in process 500 above. Top surfaces of the deposited metal layer 506 may optionally be etched into a patterned metal layer 508 or RDL. Then, one or more additional RDL layers 124 may be built-up on the top surface of the package after the vias 114 & 116 are lined or filled with metal. A dielectric 126 or other filler may be used for space-filling above the patterned 508 or unpatterned metal layer 506 and for supporting the one or more RDLs 124, when present.

A third process 510 deposits or plates a thicker metal layer 512 into the vias 114 & 116 in the patterned molding material 108. The thicker metal layer 512 may fill some vias 114 while completely leaving some empty space 514 in longer vertical vias 116. The thicker metal layer 512 may be patterned 516, and one or more RDL layers 124 built-up above the patterned thick metal layer 516 with a dielectric 126 or other nonconductive filler occupying the previously empty spaces 514 in the vias 116 and supporting the one or more RDL layers 124.

Figure 6:
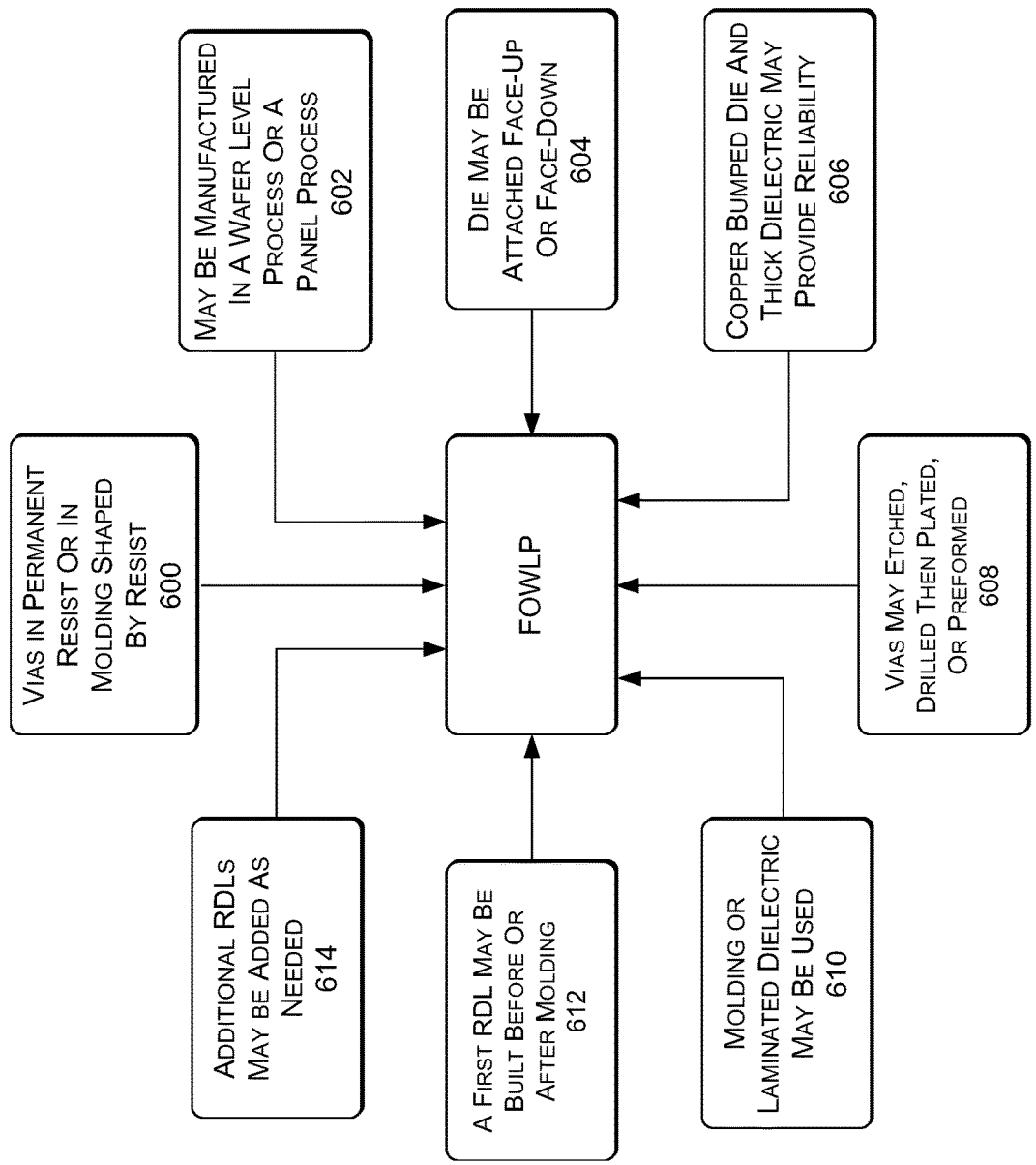
FIG. 6 is a diagram of various example options and features for a fan-out wafer level package created by the example processes described herein.

FIG. 6 summarizes some of the features available as options for example fan-out wafer level packages (FOWLPs) that can be created by the processes described herein. First, at 600, the microelectronic packages may have vias in a layer of molding 108 after temporary resist 106 is removed, or may have vias in a permanent layer of resist 202, with no extra molding necessary. The microelectronic packages may be manufactured in a wafer level process with fan-out traces, or may be manufactured in a panel fabricating process 602. Dies 104 may be placed either face-up or face-down 604 on a carrier 102. For reliability, the package may use copper-bumped dies 104 and may have a thick dielectric 126 added 606. Vias 114 & 116 may also be drilled, then plated, or preformed and plated, and formed in other ways 608 besides etching resist. A molding material 108 may be used for the molding steps, and in an implementation 610, the molding material may be a laminated dielectric 126. A first RDL 124 may be built-up before or after a molding step 612. Second and subsequent RDLs 132 may be added as needed.

Figure 7:
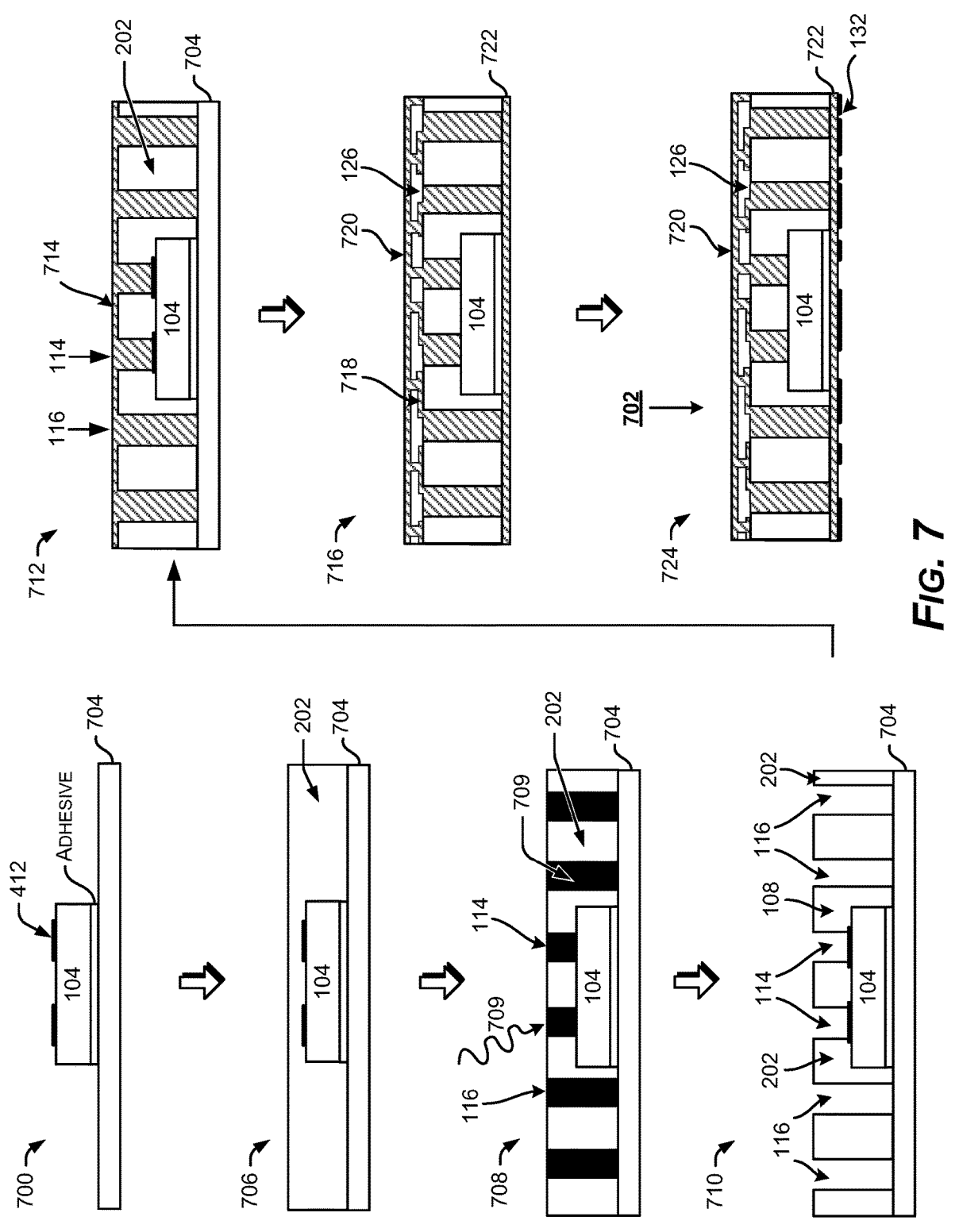

FIG. 7 shows an example assembly process 700 of manufacturing a fan-out wafer level package, with the die 104 face-up, and permanent resist 202 used in the manufacture. Fabrication of an example package 702 (shown in last step) begins with attaching a die 104 face-up to a metal sheet or an RDL on a carrier 704. The die 104 may be a single die, or may be a packaged die, stacked dies, side-by-side dies, or as a die with one or more redistribution layers (RDLs). At 706, permanent resist 202, such as a photoimagable resist 202, is applied over the die 104 and over the carrier 704. At 708, the permanent resist 202 is developed 709, for example, by photolithography, to form vias 114 over the die 104 and vertical vias 116 through the permanent resist 202 where there is no die 104. At 710, the developed permanent resist 202 is removed leaving open vias 114 over the die 104 and longer open vertical vias 116 through the molding material 108, suitable for becoming package-on-package (POP) through-vias. The vias 114 over the die can become conductive posts later in the process. At 712, the patterned permanent resist 202 is plated or metalized 714 to form conductive vias 114 & 116, and in an implementation, an RDL layer. At 716, one or more additional RDL layers 718 & 720 may be formed on top for providing fan-out conductive traces or for adding subsequent RDLs, with dielectric 126 or other filler occupying voids and supporting the RDLs 720. A support component of the carrier 704 may be removed, leaving a conductive layer 722. At 724, one or more backside RDL layers 132 may also be added.

Figure 8:
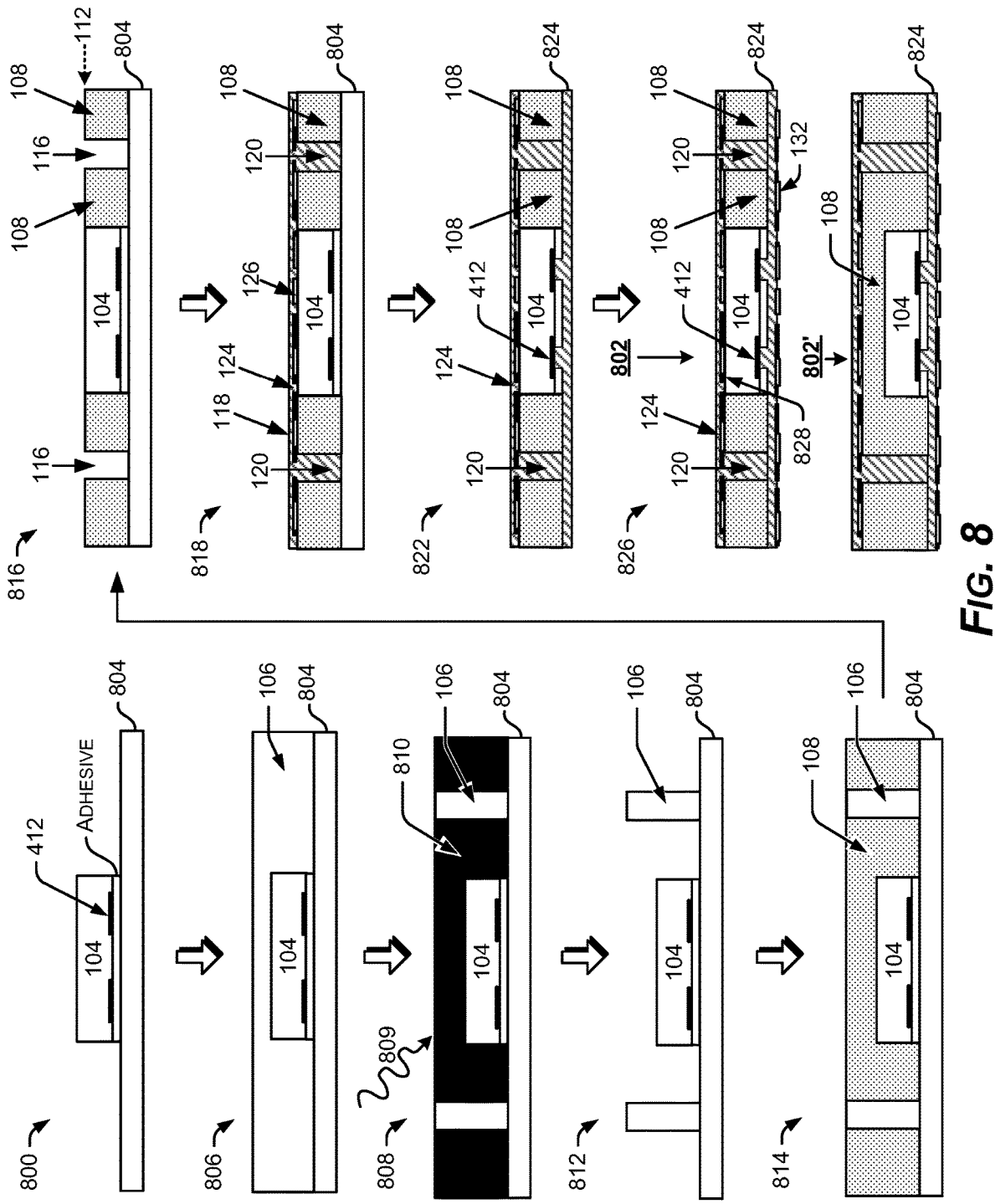
FIG. 8 is a diagram of an example process for making vias in an example microelectronics package with dies face-down, using temporary resist.

FIG. 8 shows an example assembly process 800 of manufacturing a fan-out wafer level package with the die 104 face-down, and temporary resist 106 used in the manufacture. Fabrication of an example package 802 or 802' (shown at final step in FIG. 8) begins with attaching a die 104 face-down to a metal sheet or an RDL on a carrier 804. Face-down means that one-sided electrical contacts of the die 104 face the carrier 804 when the die 104 is adhered to the carrier 804. The die 104 may be a single die, or may be a packaged die, stacked dies, side-by-side dies, or as a die with one or more redistribution layers (RDLs). At 806, temporary resist 106, such as a photoimagable resist 106, is applied over the die 104 and over the carrier 804. At 808, the temporary resist 106 is developed 810, for example, by photolithography. At 812, the developed resist 810 is removed, leaving undeveloped temporary resist 106 in place. At 814, a molding material 108 is applied over the die 104 and the carrier 102 surfaces that are still exposed from the top. The undeveloped temporary resist 106 forms or shapes the molding material 108, with the space occupied by the temporary resist 106 becoming the vias 116 when the temporary resist 106 is removed. At 816, the top surface of the package 802 may be lapped or planarized. The remaining temporary photoresist 106 is then stripped or otherwise removed leaving patterned molding material 108 with vertical vias 116 formed through the molding material 108 by the removed temporary resist 106, suitable for providing package-on-package (POP) through-vias. At 818, the patterned molding material 108 is plated or metalized 118 to form conductive vias 120 and pads. The top metalization layer may be patterned into circuits or an RDL, and one or more RDL layers 124 may be formed on top for providing fan-out conductive traces, with dielectric 126 or other nonconductive filler occupying voids and supporting the one or more RDLs 124. At 822, a support component of the carrier 804 may be removed, leaving a metal layer 824 of the carrier 804, or the carrier 804 is removed entirely and the bottom of the assembly can be etched and metalized 824 for forming circuits coupled to the down-facing die pads 412. At 826, one or more backside RDL layers 132 may also be added, coupled in electrical contact with the conductive die pads 412. The top RDL(s) 124 may be formed closely on top of the back face 828 of the die 104 as in package 802, or on a thicker layer of the intervening molding material 108 placed at step 814, as in package 802'.

Figure 9:
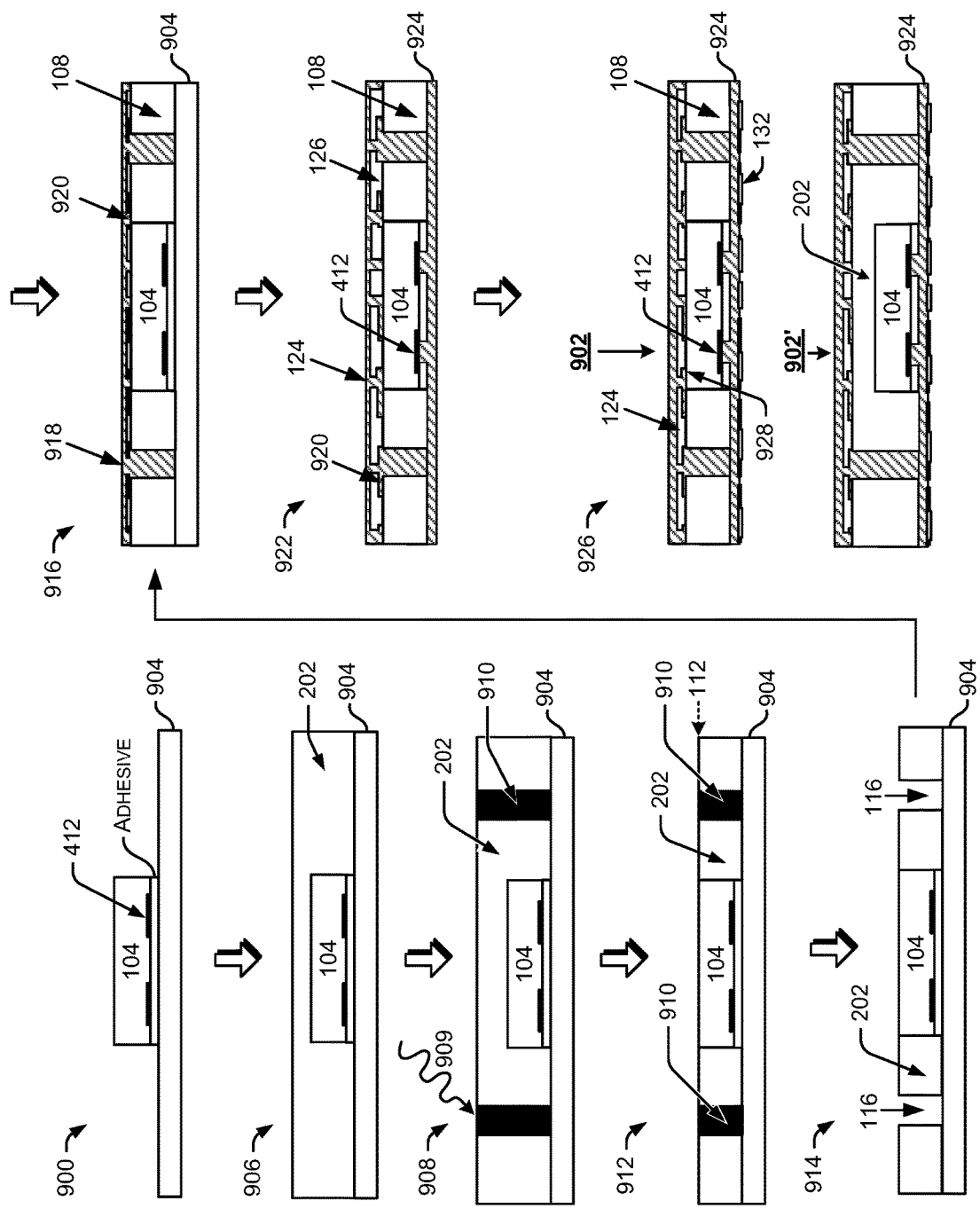
FIG. 9 is a diagram of an example process for making vias in an example microelectronics package with dies face-down, using permanent resist.

FIG. 9 shows an example assembly process 900 of manufacturing a fan-out wafer level package 902 or 902' (shown at final step in FIG. 9) with the die 104 face-down, and permanent resist 202 used in the manufacture. Fabrication of an example package 902 or 902' begins with attaching a die 104 face-down to a metal sheet or an RDL on a carrier 904. The die 104 may be a single die, or may be a packaged die, stacked dies, side-by-side dies, or as a die with one or more redistribution layers (RDLs). At 906, permanent resist 202, such as a photoimagable resist 202, is applied over the die 104 and over the carrier 904. At 908, the permanent resist 202 is developed, by photolithography for example, resulting in areas of developed resist 910. At 912, the top of the package may be lapped or planarized 112. At 914, the developed resist 910 is removed, leaving open vertical vias 116. At 916, the open vertical vias 116 are metalized 918 by deposition, plating, or other techniques, and an RDL 920 may be formed on top. At 922, one or more additional RDL layers 124 may be formed on top for providing fan-out conductive traces, with dielectric 126 or other filler occupying voids and supporting the RDLs 124. At least a supporting layer of the carrier 904 is also removed, leaving a metal layer 924 or allowing closer access to the conductive die pads 412. At 926, one or more backside RDLs 132 may be built in conductive contact with the electrical contacts 412 of the die 104. The top RDL(s) 124 may be formed closely on top of the back face 928 of the die 104 as shown in package 902, or on an intervening layer of the resist material 202, when a thicker layer of the resist material 202 is maintained between steps 910-912, as shown in package 902'.

Example Methods

Figure 10:
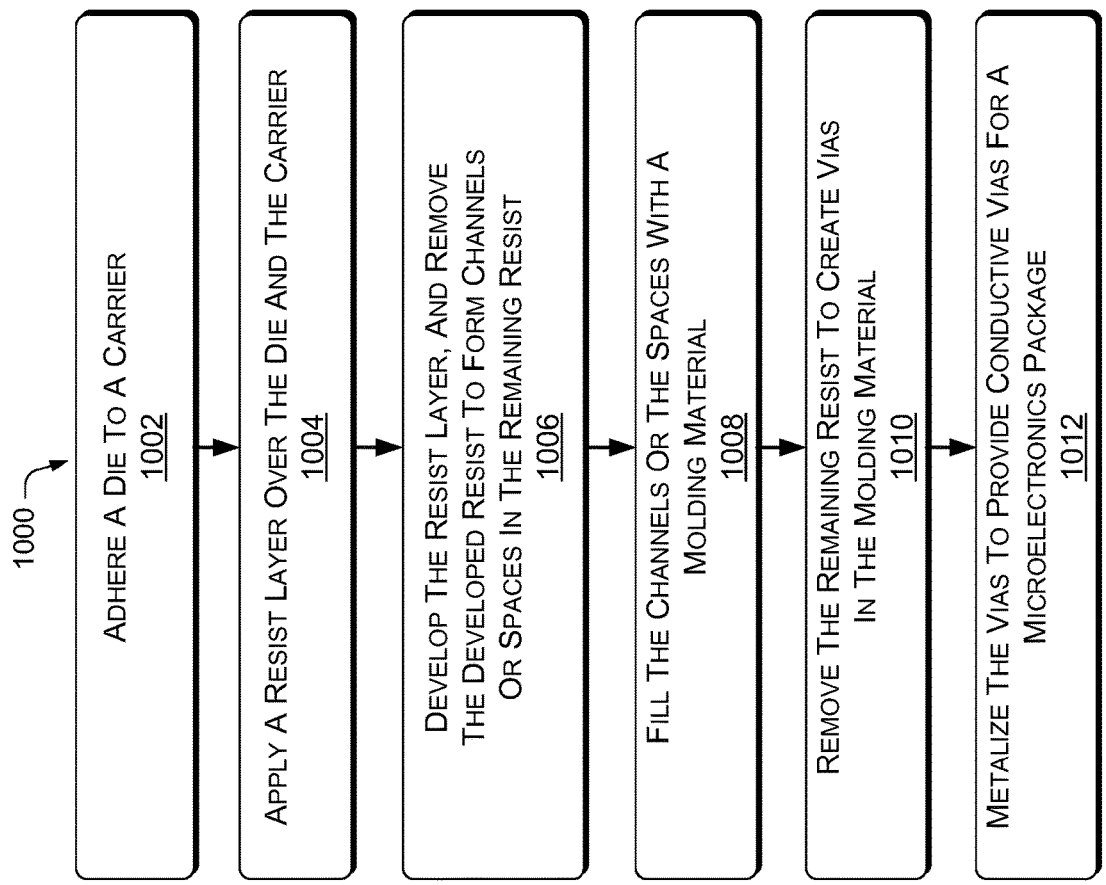
FIG. 10 is a flow diagram of an example method of making an electronics package with temporary resist used to shape molding, and the molding used to form permanent vias in the package.

FIG. 10 shows an example method 1000 of making an electronics package with temporary resist used to form permanent vias in the package. Operations of the example method 1000 are shown as individual blocks.

At block 1002, a die is adhered to a carrier.

At block 1004, a resist layer is applied over the die and carrier.

At block 1006, the resist is developed and the developed resist is removed, creating channels or spaces in the remaining resist.

At block 1008, the channels or spaces in the remaining resist are filled with a molding material.

At block 1010, the remaining resist is removed, creating vias in the molding material.

At block 1012, the vias are metalized to provide conductive vias in the package.

Figure 11:
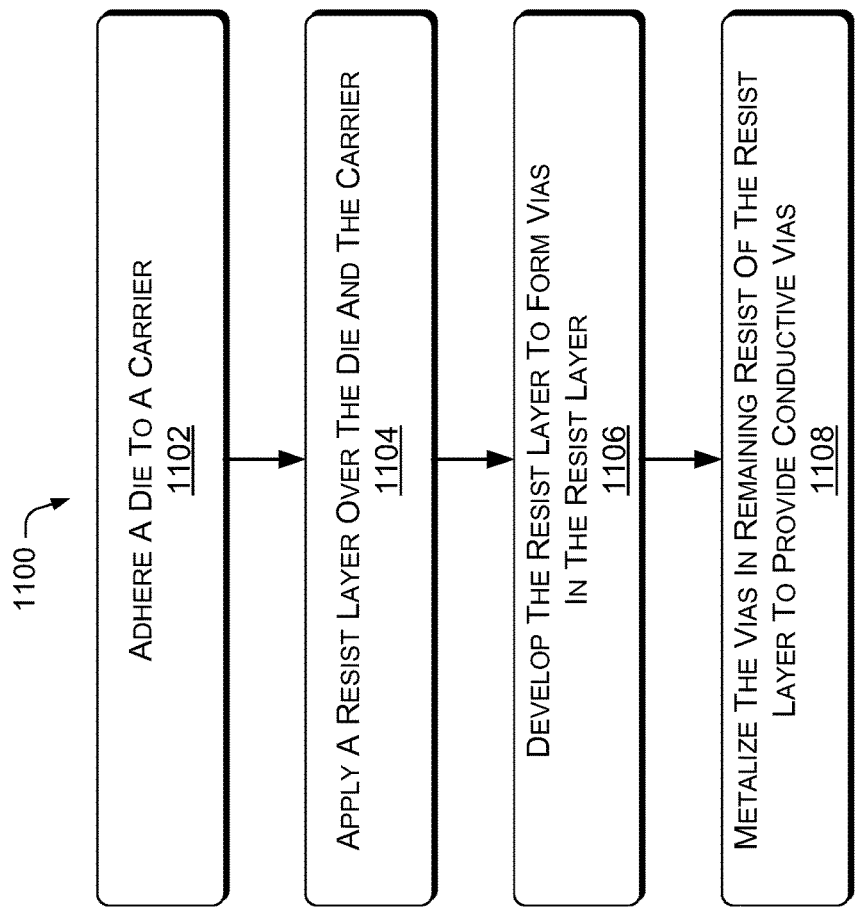
FIG. 11 is a flow diagram of an example method of making a microelectronics package with permanent resist used for vias in the microelectronics package.

FIG. 11 shows an example method 1100 of making a microelectronics package with permanent resist used to form conductive vias in the microelectronics package. Operations of the example method 1100 are shown as individual blocks.

At block 1102, a die is adhered to a carrier.

At block 1104, a layer of resist is applied over the die and the carrier.

At block 1106, the layer of resist is developed to form vias in the layer of resist.

At block 1108, the vias in the layer of resist are metalized to provide conductive vias for the microelectronics package.

In the above specification and appended claims: the terms "connect," "connection," "connected," "in connection with," and "connecting," are used to mean "in direct connection with" or "in connection with, via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A method, comprising:
   adhering a die to a carrier for making a microelectronics package;
   applying a resist layer as molding to the die and the carrier, the resist layer having a flat top surface:
   developing parts of the resist layer with photolithography to form vias in the resist layer from the flat top surface of the resist layer to a conductive area of the die and to a conductive area of the carrier, wherein undeveloped parts of the resist layer remain permanently on the die and the carrier; and
   conformally depositing a thin lining of a metal in the vias to provide conductive pathways through the resist layer to the conductive area of the die, and on the flat top surface of the resist layer, and to the conductive area of the carrier simultaneously thereby forming contact vias and vertical package-on-package (POP) vias in the resist layer in a single photolithography pass; and
   etching the thin lining of the metal on the flat top surface of the resist layer to convert the thin lining of the metal to a patterned metal layer or a redistribution layer (RDL).

2. The method of claim 1, wherein the resist layer comprises a photoimagable resist.

3. The method of claim 1, further comprising drilling or forming one or more holes in the resist layer to form at least one of the vias.

4. The method of claim 1, wherein depositing the thin lining of the metal in the vias further comprises lining the vias with the metal and filling a remaining space in the vias with a dielectric material or a nonconducting filler material.

5. The method of claim 1, further comprising forming the patterned metal layer or the redistribution layer coupled to the conductive pathways.

6. The method of claim 1, wherein the die is adhered face-up on the carrier.

7. The method of claim 1, wherein the carrier comprises a layer of aluminum or a support material, and a layer of copper releasably attached to the aluminum or the support material.

8. The method of claim 1, further comprising:
forming the contact vias and vertical package-on-package (POP) vias in the resist layer simultaneously in one lithography pass to provide an exact a substantially perfect registration of the contact vias and the vertical POP vias; and
the plating or depositing the thin lining of the metal in the contact vias and the vertical POP vias simultaneously and conformly in a single step, to make conductive contact vias and conductive vertical POP vias with exact registration.

* * * * *